United States Patent
Barna

[19]

[11] Patent Number: 6,157,695
[45] Date of Patent: Dec. 5, 2000

[54] COUNTER FOR PERFORMING MULTIPLE COUNTS AND METHOD THEREOF

[75] Inventor: Paul Barna, Tempe, Ariz.

[73] Assignee: Microchip Technology, Inc., Chandler, Ariz.

[21] Appl. No.: 09/179,120

[22] Filed: Oct. 26, 1998

[51] Int. Cl.[7] .................................................. H03K 21/02
[52] U.S. Cl. ............................ 377/52; 377/54; 377/111
[58] Field of Search ................................. 377/111, 52, 54

[56] References Cited

U.S. PATENT DOCUMENTS

| | | | |
|---|---|---|---|
| 5,842,006 | 11/1998 | Harvey et al. ............................. | 377/52 |
| 5,982,840 | 11/1999 | Aisaka ...................................... | 377/111 |

FOREIGN PATENT DOCUMENTS

| | | |
|---|---|---|
| 1-319326 | 12/1989 | Japan . |
| 2-007616 | 1/1990 | Japan . |
| 3-069212 | 3/1991 | Japan . |
| 4-190410 | 7/1992 | Japan . |

OTHER PUBLICATIONS

Feb. 1, 2000, PCT International Search Report.

*Primary Examiner*—Margaret R. Wambach
*Attorney, Agent, or Firm*—Baker Botts L.L.P.

[57] ABSTRACT

A loadable counter circuit which is able to perform multiple contiguous counts. The loadable counter circuit uses a counter for monitoring a number of specified events. A data storage device is coupled to the counter for loading the counter with counter values for each of the contiguous counts. A control logic circuit is coupled to the counter and to the data storage circuit for loading the counter and the data storage device with the counter values.

11 Claims, 1 Drawing Sheet

COUNTER FOR PERFORMING MULTIPLE COUNTS AND METHOD THEREOF

BACKGROUND OF THE INVENTION

1. Field of the Invention

This invention relates generally to a counter circuit and, more specifically, to a counter circuit which may be loaded with different count values for the purpose of tracking multiple contiguous events at different times and a method therefor.

2. Description of the Prior Art

Counters have been around for many years. Many systems such as emulators, logic analyzers, as well as other digital logic applications use counters as a means to measure the length of time or for counting a specific number of event occurrences. In many of these systems, multiple counts that are contiguous over time are often desired. Presently, for multiple contiguous count applications, most systems use individual counters for each contiguous count.

Therefore, a need existed to provide an improved counter circuit that would replace a plurality of individual counters. The improved counter circuit would be a loadable counter. The loadable counter would be able to be loaded with different count values for the purpose of tracking multiple contiguous events at different counts.

SUMMARY OF THE INVENTION

In accordance with one embodiment of the present invention, it is an object of this invention to provide an improved counter circuit.

It is another object of the present invention to provide an improved loadable counter circuit.

It is still another object of the present invention to provide an improved loadable counter which would be able to be loaded with different count values for the purpose of tracking multiple contiguous events at different counts.

It is still a further object of the present invention to provide an improved counter circuit which would replace a plurality of individual counters.

BRIEF DESCRIPTION OF THE PREFERRED EMBODIMENTS

In accordance with one embodiment of the present invention, a loadable counter circuit which is able to perform multiple contiguous counts is disclosed. The loadable counter circuit uses a counter for monitoring a number of specified events. A data storage device is coupled to the counter for loading the counter with counter values for each of the contiguous counts. A control logic circuit is coupled to the counter and to the data storage circuit for loading the counter and the data storage device with the counter values.

In accordance with another embodiment of the present invention, a method of providing a loadable counter circuit which is able to perform multiple contiguous counts is disclosed. The method comprises the steps of: providing a counter for monitoring a number of specified events; providing a data storage device coupled to the counter for loading the counter with counter values for each of the contiguous counts; and providing a control logic circuit coupled to the counter and to the data storage circuit for loading the counter and the data storage device with the counter values.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
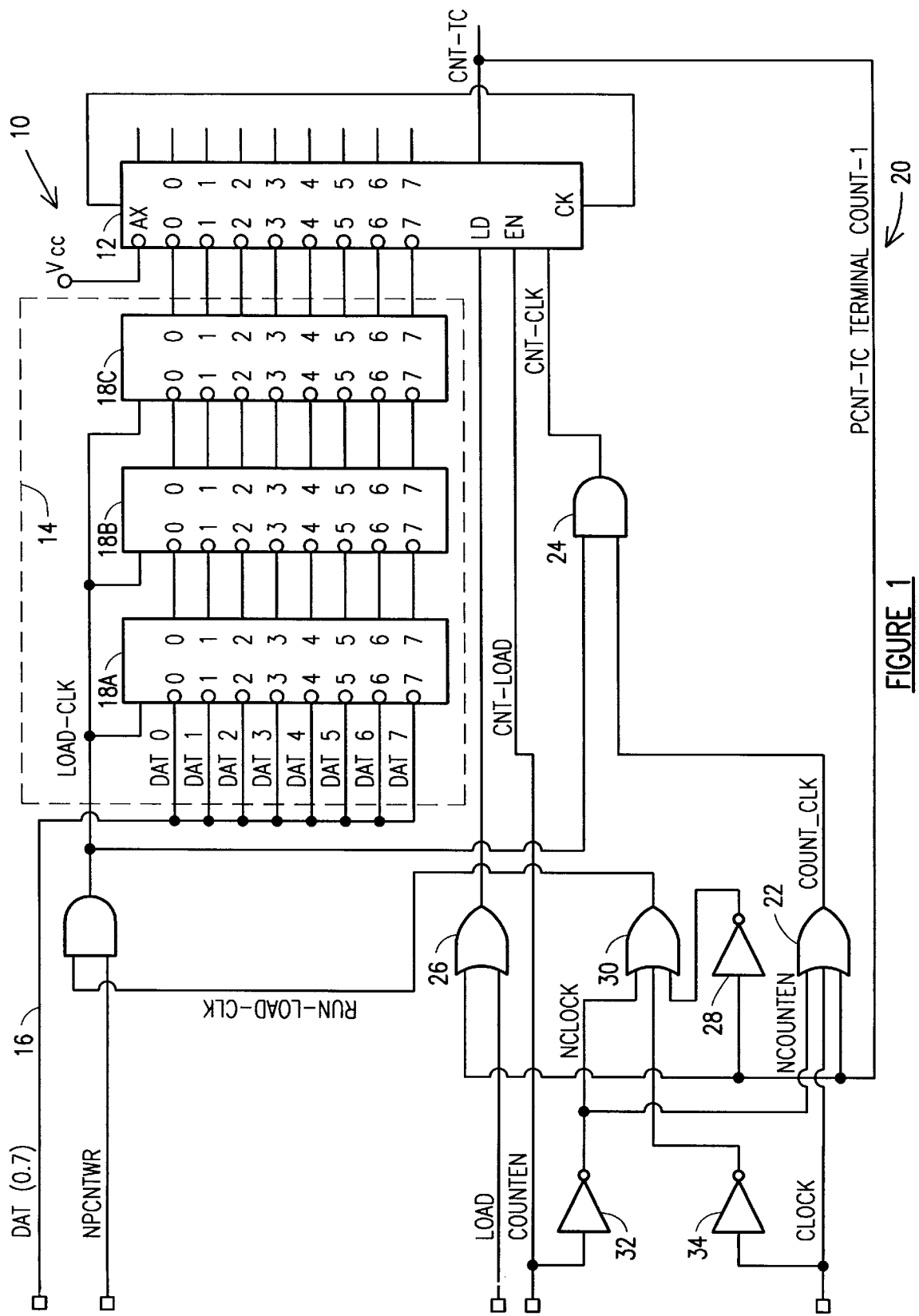
FIG. 1 is a simplified functional block diagram of a counter for performing multiple contiguous counts.

Referring to FIG. 1, a loadable counter circuit for performing multiple contiguous counts 10 (hereinafter loadable counter circuit 10) is shown. The loadable counter circuit 10 uses a counter 12 for monitoring a number of specified events. The counter 12 has a clock input (CK) for receiving a run time clock signal. The counter 12 further has a count enable (EN) input for receiving a signal to enable and disable the counter 12 and a data load input (LD) for receiving a signal to inform the counter 12 to load the counter 12 with a new counter value. In the embodiment shown in FIG. 1, the counter 12 is an 8-bit decrementing counter. Thus, the counter 12 has eight (8) inputs for receiving data to be loaded into the counter 12. It should be noted that the counter 12 may be an incrementing or decrementing counter and may be any number of bits. The size and type of the counter 12 should not be seen as to limit the scope of the present invention.

The counter 12 is coupled to a data loading device 14. The data loading device 14 is used for loading the counter 12 with counter values for each contiguous count performed by the loadable counter circuit 10. Data is loaded into the data loading device 14 by a data bus 16. In the embodiment depicted in FIG. 1, the data loading device 14 is a multi-register pipeline. The multi-register pipeline is comprised of a plurality of registers 18A–18C. In the embodiment depicted in FIG. 1, a three register pipeline is shown. However, the pipeline data path may incorporate any number of registers 18A–18C. Data is loaded by the bus 16 into the counter 12 by shifting the data through the multi-register pipeline data path into the counter 12.

The loadable counter circuit 10 uses a plurality of signal lines for loading the counter 12 with new counter values. The NPCNTWR is a signal line used to clock data into the counter 12 and the plurality of registers 18A–18C. For the embodiment depicted in FIG. 1, the NPCNTWR signal is an active low signal. Furthermore, in the present embodiment, the NPCNTWR signal must write four consecutive count values via the pipeline registers 18 when loading the counter 12 with a value. These values correspond to the count values for each contiguous count sequence.

A LOAD signal line is used to enable the counter 12 to be loaded with data. In the embodiment depicted in FIG. 1, the LOAD signal is an active high signal. The LOAD signal must be asserted high when the counter 12 is to be loaded with a data value.

A COUNTEN signal is used to enable the counter 12 to increment/decrement (depending on the type of counter 12) the counter value. In the embodiment depicted in FIG. 1, the COUNTEN signal is an active high signal. The COUNTEN signal is asserted low when loading counter 12 with initial count values. The COUNTEN signal is high when the counter 12 is loaded with a new value during run time.

The loadable counter circuit 10 further uses a CLOCK signal. The CLOCK signal is a high speed clock signal that provides a run time clock to the counter 12.

The loadable counter circuit 10 has a control logic circuit 20. The control logic circuit 20 is used to control the loading of data values in the counter 12 and the data loading device 14. The control logic circuit 20 is comprised of a 25 plurality of logic gates. An OR gate 22 has an input coupled to the CLOCK signal. The CLOCK signal is ORed with the COUNTEN signal and an inverted terminal count signal which is outputted by the counter 12. The output of the OR gate 22 (COUNT_CLK) is run through an AND gate and is used as a clock signal (CNT-CLK) for the counter 12.

When the counter 12 reaches its terminal count, the terminal count output (TC) of the counter 12 is asserted high. The TC output is fed back as a counter terminal count (CNT-TC) input signal to the control logic circuit 20. The CNT-TC signal is used as an input signal to an OR gate 26. The CNT-TC signal is ORed with the LOAD signal at the OR gate 26. When the counter 12 reaches a terminal count, the output of the OR gate 26 (CNT-LOAD) is forced high. The CNT-TC signal is also ORed with the CLOCK signal at the OR gate 22 to "switch in" the COUNT-CLK or RUN-LOAD-CLK.

The COUNTEN signal is inverted by the inverter 32 and is used as one input to an OR gate 30. The CLOCK signal is also inverted by an inverter 34 and is used as a second input to the OR gate 30. When the CNT-TC signal is high, the TC output CNT-TC of the counter 12 is inverted by the inverter 28, which in turns, allows an inverted clock (NCLOCK) signal to pass through the OR gate 30 and latch in a new counter value being held in a last register 18C of the data loading device 14. This further advances the pipeline data held in registers 18A and 18B via the signals RUN-LOAD-CLK and LOAD-CLK. As soon as the new value is loaded into the counter 12, CNT-TC is asserted low, CNT-LOAD is asserted low, RUN-LOAD-CLK is asserted high, and COUNT-CLK is asserted low (via the CLOCK signal at the OR gate 22), allowing the counter 12 to be incremented/decremented at the rising edge of the next CLOCK signal. This process will occur at each terminal count.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A loadable counter circuit which is able to perform multiple contiguous counts comprising, in combination:
    a counter for monitoring a number of specified events;
    a data storage device coupled to said counter for loading said counter with counter values for each of said contiguous counts;
    a control logic circuit coupled to said counter and to said data storage circuit for loading said counter and said data storage device with said counter values, and
    an enable signal coupled to said counter for enabling said counter and for disabling said counter when said counter is being loaded with one of said counter values, wherein said control logic circuit comprises:
    a first clock signal line for signalling said data storage device;
    a load signal line for signalling said counter to load a next counter value from said data storage device;
    a second clock signal line for providing a run time clock to said counter; and
    terminal count signal line coupled to said control logic circuit for signalling said control logic circuit to load said counter with a new counter value.

2. A loadable counter circuit which is able to perform multiple contiguous counts in accordance with claim 1 wherein said control logic circuit further comprises:
    a first logic gate having a first input coupled to an inverted enable signal, a second input coupled to said second clock signal line, and a third input coupled to said terminal count signal line;
    a second logic gate having a first input coupled to said inverted enable signal, a second input coupled to an inverted second clock signal line, and a third input coupled to an inverted terminal count signal line;
    a third logic gate having a first input coupled to said terminal count signal line and a second input coupled to said load signal line;
    a fourth logic gate having a first input coupled to an output of said second logic gate and a second input coupled to said first clock signal line; and
    a fifth logic gate having a first input coupled to an output of said fourth logic gate and a second input coupled to an output of said first logic gate.

3. A loadable counter circuit which is able to perform multiple contiguous counts in accordance with claim 2 wherein said first logic gate, said second logic gate, and said third logic gate are all OR gates.

4. A loadable counter circuit which is able to perform multiple contiguous counts in accordance with claim 2 wherein said fourth logic gate and said fifth logic gate are AND gates.

5. A loadable counter circuit which is able to perform multiple contiguous counts comprising, in combination:
    a counter for monitoring a number of specified events;
    a data storage device coupled to said counter for loading said counter with counter values for each of said contiguous counts wherein said data storage device is a plurality of registers wherein each of said plurality of registers is coupled to a directly succeeding register except a last register of said plurality of registers is coupled to said counter;
    a data bus coupled to a first of said plurality of registers for loading said plurality of registers with said counter values;
    an enable signal coupled to said counter for enabling said counter and for disabling said counter when said counter is being loaded with one of said counter values; and
    control logic circuit coupled to said counter and to said data storage circuit for loading said counter and said data storage device with said counter values, said control logic circuit comprising:
    a first clock signal line for signalling said data storage device;
    a load signal line for signalling said counter to load a next counter value from said data storage device;
    a second clock signal line for providing a run time clock to said counter;
    terminal count signal line coupled to said control logic circuit for signalling said control logic circuit to load said counter with a new counter value;
    a first logic gate having a first input coupled to an inverted enable signal, a second input coupled to said second clock signal line, and a third input coupled to said terminal count signal line
    a second logic gate having a first input coupled to said inverted enable signal, a second input coupled to an inverted second clock signal line, and a third input coupled to an inverted terminal count signal line;

a third logic gate having a first input coupled to said terminal count signal line and a second input coupled to said load signal line;

a fourth logic gate having a first input coupled to an output of said second logic gate and a second input coupled to said first clock signal line; and a fifth logic gate having a first input coupled to an output of said fourth logic gate and a second input coupled to an output of said first logic gate.

6. A loadable counter circuit which is able to perform multiple contiguous counts in accordance with claim 5 wherein said first logic gate, said second logic gate, and said third logic gate are all OR gates.

7. A loadable counter circuit which is able to perform multiple contiguous counts in accordance with claim 5 wherein said fourth logic gate and said fifth logic gate are AND gates.

8. A method of providing a loadable counter circuit which is able to perform multiple contiguous counts comprising the steps of:

providing a counter for monitoring a number of specified events;

providing a data storage device coupled to said counter for loading said counter with counter values for each of said contiguous counts; and providing a control logic circuit coupled to said counter and to said data storage circuit for loading said counter and said data storage device with said counter values, wherein said step of providing said data storage device further comprises the step of providing a plurality of registers wherein each of said plurality of registers is coupled to a directly succeeding register except a last register of said plurality of registers is coupled to said counter, wherein said step of providing said control logic circuit further comprises the steps of:

providing a first clock signal line for signalling said data storage device;

providing a load signal line for signalling said counter to load a next counter value from said data storage device;

providing a second clock signal line for providing a run time clock to said counter; and providing terminal count signal line coupled to said control logic circuit for signalling said control logic circuit to load said counter with a new counter value.

9. The method of claim 8 wherein said step of providing said control logic circuit further comprises the steps of:

providing a first logic gate having a first input coupled to an inverted enable signal, a second input coupled to said second clock signal line, and a third input coupled to said terminal count signal line;

providing a second logic gate having a first input coupled to said inverted enable signal, a second input coupled to an inverted second clock signal line, and a third input coupled to an inverted terminal count signal line;

providing a third logic gate having a first input coupled to said terminal count signal line and a second input coupled to said load signal line;

providing a fourth logic gate having a first input coupled to an output of said second logic gate and a second input coupled to said first clock signal line; and providing a fifth logic gate having a first input coupled to an output of said fourth logic gate and a second input coupled to an output of said first logic gate.

10. The method of claim 9 wherein said first logic gate, said second logic gate, and said third logic gate are all OR gates.

11. The method of claim 9 wherein said fourth logic gate and said fifth logic gate are AND gates.

* * * * *